United States Patent
Ha et al.

(10) Patent No.: US 8,211,491 B2
(45) Date of Patent: Jul. 3, 2012

(54) METHOD OF MANUFACTURING A LIGHT-EMITTING ELEMENT AND METHOD OF MANUFACTURING A DISPLAY SUBSTRATE USING THE SAME

(75) Inventors: Jae-Kook Ha, Yongin-si (KR); Chang-Woong Chu, Suwon-si (KR); Jin-Koo Chung, Suwon-si (KR); Joo-Hyeon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 706 days.

(21) Appl. No.: 12/357,327

(22) Filed: Jan. 21, 2009

(65) Prior Publication Data
US 2009/0221209 A1    Sep. 3, 2009

(30) Foreign Application Priority Data
Mar. 3, 2008   (KR) .................. 10-2008-0019709

(51) Int. Cl.
*B05D 7/22* (2006.01)
(52) U.S. Cl. ...................... 427/66; 427/372.2
(58) Field of Classification Search .............. 427/66, 427/372.2
See application file for complete search history.

(56) References Cited

U.S. PATENT DOCUMENTS

| | | | |
|---|---|---|---|
| 6,824,893 B2 * | 11/2004 | Hoag et al. | 428/690 |
| 7,116,058 B2 | 10/2006 | Lo et al. | |
| 2002/0197393 A1 * | 12/2002 | Kuwabara | 427/66 |
| 2003/0044645 A1 * | 3/2003 | Kambe et al. | 428/690 |
| 2003/0219530 A1 * | 11/2003 | Yamazaki et al. | 427/66 |

FOREIGN PATENT DOCUMENTS

| | | |
|---|---|---|
| JP | 2004-71473 | 3/2004 |
| KR | 2004-0019770 | 3/2004 |
| KR | 2006-0067893 | 6/2006 |

* cited by examiner

*Primary Examiner* — Christina Johnson
*Assistant Examiner* — Saeed Huda
(74) *Attorney, Agent, or Firm* — Innovation Counsel LLP

(57) ABSTRACT

In accordance with one or more embodiments of the present disclosure, a method of manufacturing a light-emitting element includes forming an anode on a substrate, forming a first transport layer including one or more first polar compounds on the anode, forming a first non-polar solvent layer on the first transport layer, forming a first polar solution layer including one or more light-emitting compounds on the first non-polar solvent layer, drying a polar solvent of the first polar solution layer and the first non-polar solvent layer so that a light-emitting layer including the one or more light-emitting compounds is formed on the first transport layer and forming a cathode on the light-emitting layer. The cathode is disposed opposite to the anode. As such, damage to the first transport layer may be reduced when forming the light-emitting layer, which may improve the reliability and productivity of a manufacturing process.

22 Claims, 12 Drawing Sheets

METHOD OF MANUFACTURING A LIGHT-EMITTING ELEMENT AND METHOD OF MANUFACTURING A DISPLAY SUBSTRATE USING THE SAME

CROSS-REFERENCE TO RELATED APPLICATIONS

This application claims priority to and the benefit of Korean Patent Application No. 2008-19709, filed on Mar. 3, 2008, in the Korean Intellectual Property Office (KIPO), the contents of which are incorporated herein by reference in their entirety.

BACKGROUND

1. Technical Field

Embodiments of the present disclosure relate to a method of manufacturing a light-emitting element and a method of manufacturing a display substrate using the same. More particularly, embodiments of the present disclosure relate to a method of manufacturing a light-emitting element used for an organic light-emitting display (OLED) device and a method of manufacturing a display substrate using the same.

2. Related Art

Recently, organic light-emitting diode (OLED) display devices are capable of overcoming deficiencies of liquid crystal display (LCD) devices. Generally, an OLED display device includes two electrodes and a light-emitting layer disposed between the two electrodes. The light-emitting layer may be formed using an organic material. Excitons are formed in an organic light-emitting layer. Excitons are formed by combining electrons injected from a first electrode into the organic light-emitting layer and holes injected from a second electrode into the organic light-emitting layer, and then the excitons emit the energy so as to emit light. The OLED display device is a light-emitting type display device that does not need a separate light source. Thus, in comparison with the LCD display device, the OLED display device consumes less power and has an improved display quality, response time, viewing angle, contrast ratio, etc.

Processes for forming a layer of the OLED display device are divided into a dry process and a wet process. In the dry process, the layer is formed by depositing an organic material in a vacuum state, and the organic material may generally be a low-molecular compound. In the wet process, the layer is formed by a printing process including processes of spin-coating or jetting a solution having an organic material and drying the solution, and the organic material may generally be a high-molecular compound.

In the wet process, various compounds such as the low-molecular compound, the high-molecular compound, etc., may be used for the layer, and the layer may be formed on a substrate as compared with the dry process. However, a second layer may not be formed on a first layer using the wet process. When the second layer is formed on the first layer, the first layer is dissolved in a solution of the second layer so that the second layer may not be easily formed on the first layer. Hence, the layers formed through the wet process may have decreased reliability in the OLED display device, and the selection of materials forming the layers may be inadequate.

SUMMARY

One or more embodiments of the present disclosure provide a method for manufacturing a light-emitting element capable of improving the reliability of layers and productivity. One or more embodiments of the present disclosure provide a method of manufacturing a display substrate using the same.

In accordance with an embodiment of the present disclosure, a method for manufacturing a light-emitting element includes forming an anode on a substrate. A first transport layer is formed on the anode, and the first transport layer is formed using one or more first polar compounds. A first non-polar solvent layer is formed on the first transport layer. A first polar solution layer is formed on the first non-polar solution layer using one or more light-emitting compounds. A polar solvent of the first polar solution layer and a non-polar solvent of the first non-polar solvent layer are dried so that a light-emitting layer including the one or more light-emitting compounds is formed on the first transport layer. A cathode is formed on the light-emitting layer, the cathode being disposed opposite to the anode. A second transport layer may be formed between the light-emitting layer and the cathode. For forming the second transport layer, a second non-polar solvent layer may be formed on the light-emitting layer, and a second polar solution layer including one or more second polar compounds may be formed on the second non-polar solvent layer. A polar solvent of the second polar solution layer and a non-polar solvent of the second non-polar solvent layer may be dried to form the second transport layer including the one or more second polar compounds on the light-emitting layer.

Examples of the non-polar solvent of the first non-polar solvent layer may include benzene, ether, trichloromethane (chloroform), pentane, hexane, etc.

Examples of the polar solvent of the first polar solution layer may include propanone (acetone), phenylmethane toluol methylbenzene (toluene), dimethyl sulfoxide, etc.

In accordance with an embodiment of the present disclosure, a method for manufacturing a display substrate includes forming a switching element on a base substrate. The switching element is connected to a gate line and a data line crossing the gate line, and a driving element is electrically connected to the switching element. A pixel electrode is formed on the substrate having the switching element and the driving element. The pixel electrode is electrically connected to the driving element. A first transport layer is formed on the substrate formed the pixel electrode, and the first transport layer includes one or more first polar compounds. A first non-polar solvent layer is formed on the substrate formed the first transport layer. A first polar solution layer is formed on the first non-polar solvent layer, and the first polar solution includes one or more light-emitting compounds. A polar solvent of the first polar solution layer and a non-polar solvent of the first non-polar solvent layer are dried so that a light-emitting layer is formed on the first transport layer. A common electrode is formed on the substrate having the light-emitting layer, and the common electrode is disposed opposite to the pixel electrode.

In accordance with one or more embodiments of the present disclosure, when a second layer having polarity is formed on a first layer having the polarity by a wet process, a solvent layer having non-polarity is formed on the first layer, so that damage to the first layer may be reduced, and the reliability of processes for forming the layers may be improved. Moreover, the productivity of the processes may be improved by repetitively performing a jetting process and a drying process of the wet process to form a plurality of layers.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION OF EMBODIMENTS

Figure 1:
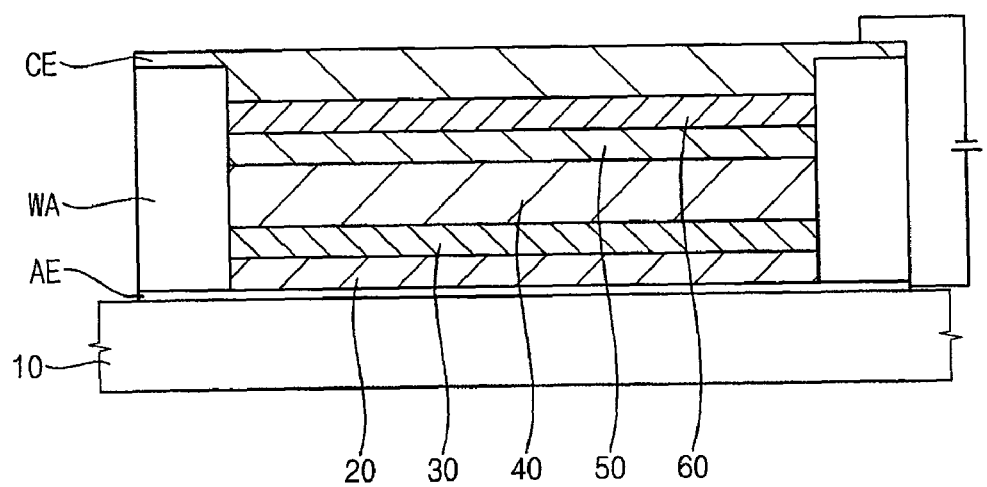
FIG. 1 is a cross-sectional view illustrating a light-emitting element, according to an embodiment of the present disclosure.

The present disclosure is described more fully hereinafter with reference to the accompanying drawings, in which embodiments of the present disclosure are shown. The present disclosure may, however, be embodied in many different forms and should not be construed as limited to the embodiments set fourth herein. Rather, these embodiments are provided so that this disclosure will be thorough and complete, and will fully convey the scope of the present disclosure to those skilled in the art. In the drawings, the sizes and relative sizes of layers and regions may be exaggerated for clarity.

In various aspects of the present disclosure, it should be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

In various aspects of the present disclosure, it should be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, processes, operations, elements, and/or components, but do not preclude the presence or addition of one or more other features, integers, processes, operations, elements, components, and/or groups thereof.

Embodiments of the present disclosure are described herein with reference to cross-section illustrations that are schematic illustrations of idealized embodiments (and intermediate structures) of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Similarly, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereafter, a light-emitting element according to an embodiment of the present disclosure is described in reference to FIG. 1. A method of manufacturing the light-emitting element is described in reference to FIGS. 2 to 13.

FIG. 1 is a cross-sectional view illustrating a light-emitting element, according to an embodiment of the present disclosure. Referring to FIG. 1, a light-emitting element 100 according to an embodiment of the present disclosure includes an anode AE, a first injection layer 20, a first transport layer 30, an organic light-emitting layer 40, a second transport layer 50, a second injection layer 60 and a cathode CE formed on a base substrate 10. The light-emitting element 100, according to an embodiment of the present disclosure, may include an insulation wall WA formed on the base substrate 10 and defines a predetermined space. The first injection layer 20, the first transport layer 30, the organic light-emitting layer 40, the second transport layer 50 and the second injection layer 60 may be formed in the predetermined space.

An electron hole, in one embodiment, is formed from the anode AE, and the electron hole is injected from the anode AE to the first injection layer 20. The anode AE may be formed using a material having conductivity and a large work function. The material may be transparent. Examples of a material that may be used for the anode AE may include indium zinc oxide (IZO), indium tin oxide (ITO), vanadium oxide, molybdenum oxide, ruthenium oxide, etc.

The first injection layer 20, in one embodiment, is formed on the anode AE. The first injection layer 20 receives the electron hole from the anode AE and easily gives the electron hole to the first transport layer 30, where the first injection layer 20 may serve as a hole injection layer. A material forming the first injection layer 20 may have ionization energy similar to that of the material forming the anode AE and lower interface adhesive strength to lower barrier energy for a hole injection from the anode AE to the first hole transport layer 30. Examples of a material that may be used for the first injection layer 20 may include copper phthalocyanine (CuPc), 4,4',4"-tris(N,N-diphenyl-amino)-triphenylamine (TDATA), N,N'-diphenyl-N,N'-bis-[4-(phenyl-m-tolyl-amino)-phenyl]-biphenyl-4,4'-diamine (DNTPD), etc.

The first transport layer 30, in one embodiment, is formed on the first injection layer 20. The first transport layer 30 receives the electron hole from the first injection layer 20 and gives the electron hole to the organic light-emitting layer 40, and the first transport layer 30 serves as a hole transport layer. A material forming the first transport layer 30 may have high electron hole mobility in order to increase the formation probability of an exciton. Examples of a material that may be used for the first transport layer 30 may include an arylene diamine derivative, a starburst derivative, a biphenyl diamine derivative having a spiro group, etc. Particularly, examples of the material may include tris-biphenylamine (TBA), naphthyl-phenyl-biphenyl diamine (NPB), N,N'-diphenyl-N,N'-bis(3-methylphenyl)-[1.1'-biphenyl]-4,4'diamine (TPD), etc.

The light-emitting layer 40, in one embodiment, is formed on the first transport layer 30. The electron hole and an electron are combined in the light-emitting layer 40 to form the exciton being a singlet or a triplet. The organic light-emitting layer 40 is emitted light by the exciton. The light-emitting layer 40 may be formed using organic light-emitting material. Examples of a material that may be used for the light-emitting layer 40 may include at least one low-molecular compound including anthracene, a phenyl-substituted cyclopentadiene derivative, 2-(2-hydroxyphenyl)benzoxazolato lithium (LiPBO), 4,4'-bis(2,2-diphenylvinyl) biphenyl (DPVBi), etc., and at least one high-molecular compound including polyphenylenevinylene, a polyphenylenevinylene derivative, polyphenylene, a polyphenylene derivative, polythiophene, a polythiophene derivative, etc. Particularly, examples of the material may include tris-(2-phenylpyridine)iridium (Ir(ppy) 3), pyrazoline, etc.

The second transport layer 50, in one embodiment, is formed on the light-emitting layer 40. The second transport layer 50 receives the electron from the second injection layer 60 formed on the second transport layer 50, and the second transport layer 50 gives the electron to the light-emitting layer 40. The second transport layer 50 serves as an electron transport layer. The electron received from the second injection layer 60 may be an electron transferred from the cathode CE to the second injection layer 60. A material forming the second transport layer 60 may have an electron carrier or high electron mobility. The electron carrier may stabilize an anion radical formed after receiving the electron from the cathode CE. Examples of a material that may be used for the second transport layer 50 may include tri-(8-quinolinolato)-aluminum (Alq3), 2-biphenyl-4-yl-5-(4-t-butylphenyl)-1,3,4-oxadiazole (PBD), etc.

The second injection layer 60, in one embodiment, is formed on the second transport layer 50. The second injection layer 60 serves as an electron injection layer received the electron from the cathode CE. Examples of a material forming the second injection layer 60 may include an organic metal complex having the high electron mobility such as lithium quinolate (LiQ), etc.

The cathode CE, in one embodiment, is formed on the second injection layer 60. Examples of a material forming the cathode CE may include a metal having a low work function such as cesium (Cs), radium (Ra), calcium (Ca), etc. In some embodiments, the material forming the cathode CE may include a metal alloy easily formed on the second injection layer 60 despite having a high work function. For example, the alloy may include aluminum (Al), copper (Cu) or silver (Ag), etc.

Figure 2:
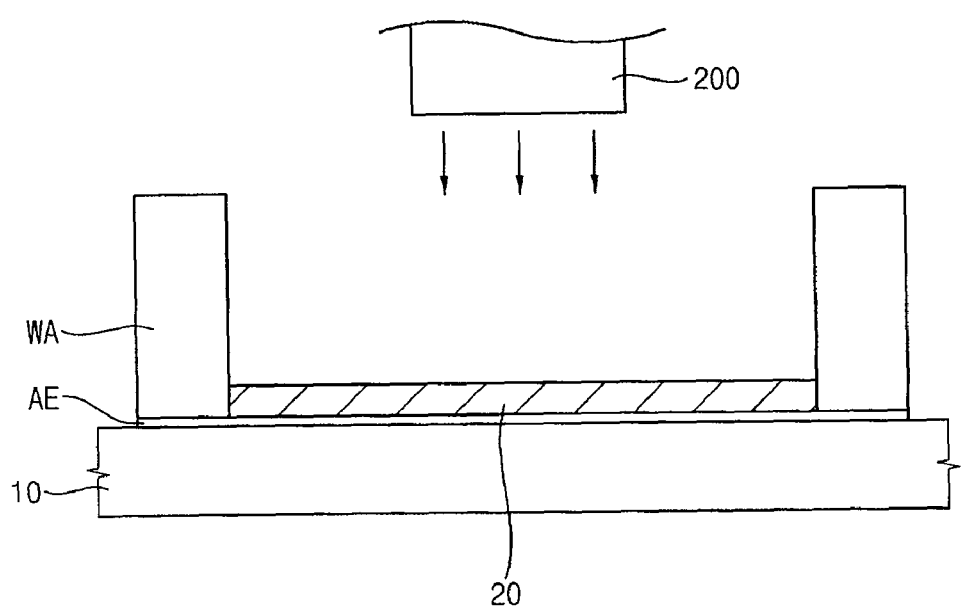
FIGS. 2 to 13 are cross-sectional views illustrating a method of manufacturing a light-emitting element, according to an embodiment of the present disclosure.

FIGS. 2 to 13 are cross-sectional views illustrating a method of manufacturing a light-emitting element, according to an embodiment of the present disclosure. In particular, FIG. 2 is a cross-sectional view illustrating a process forming the first injection layer.

Referring to FIG. 2, the anode AE, in one embodiment, is formed on the base substrate 10. The anode AE may be formed by patterning a first electrode layer (not shown) formed on the base substrate 10. Examples of a material that may be used for the first electrode layer may include indium tin oxide (ITO), and the first electrode layer may be patterned by a photolithography process.

The insulation wall WA, in one embodiment, is formed on the base substrate 10 having the anode AE. For example, an organic layer (not shown) may be formed on the base substrate 10, and the organic layer may be patterned by a photolithography process to form the insulation wall WA. The anode AE is exposed by the insulation wall WA.

The first injection layer 20, in one embodiment, is formed on the anode AE exposed by the insulation wall WA. A first ink may be jetted or applied on the anode AE using printer 200 to form a first ink layer (not shown) as a first polar solution layer, and the first injection layer 20 may be formed using the first ink layer. The first ink may be a solution including a polar hole injection material as a solute and a polar solvent. Examples of the polar hole injection material may include N,N'-diphenyl-N,N'-bis-[4-(phenyl-m-tolyl-amino)-phenyl]-biphenyl-4,4'-diamine (DNTPD), and the polar solvent may include dimethyl sulfoxide (DMSO). In various implementations, the polar solvent may include a compound having a carbonyl group, a hydroxyl group, a ketone group, etc. in molecular structure and solving the hole injection material. Examples of a material that may be used for the polar solvent may include acetone, toluene, etc. with dimethyl sulfoxide (DMSO). The first ink layer is dried from the base substrate 10 to remove the polar solvent, and then the resulting first injection layer 20 may be formed to include the hole injection material.

Figure 3:
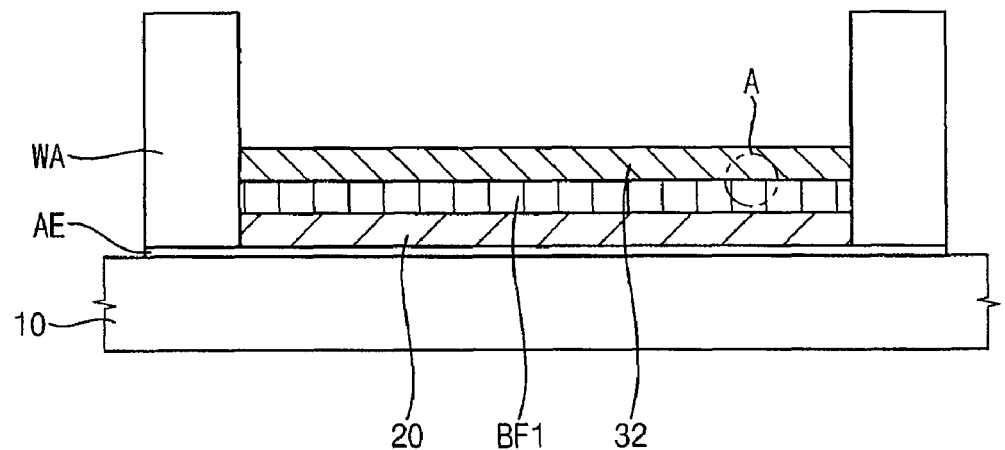

FIG. 3 is a cross-sectional view illustrating processes of forming a first non-polar solvent layer and a second ink layer. Referring to FIG. 3, the first non-polar solvent layer BF1, in one embodiment, is formed on the first injection layer 20. Examples of a material that may be used for the first non-polar solvent layer BF1 may include hexane. In various aspects, the first non-polar solvent layer BF1 does not dissolve or mix with the first injection layer 20, because the first non-polar solvent layer BF1 is relatively non-polar compared to the first injection layer 20. The first non-polar solvent layer BF1 includes a non-polar compound, and examples of the non-polar compound may include benzene, ether, pentane, etc. with hexane. In some embodiments, the first non-polar solvent layer BF1 may be formed using a non-polar compound, which includes greater than about 60 parts by weight to less than about 100 parts by weight, and a polar compound including greater than about 0 parts by weight to less than about 40 parts by weight. Thus, the first non-polar solvent layer BF1 may be entirely non-polar even though it includes a portion of a polar compound.

In one embodiment, a second ink layer 32 as a second polar solution layer is formed by jetting or applying a second ink on the non-polar solvent layer BF1. The second ink may be a solution including a polar hole transport material as a solute and a polar solvent. Examples of the hole transport material may include naphthyl-phenyl-biphenyl diamine (NPB), and examples of the solvent may include dimethyl sulfoxide (DMSO). In some embodiments, the polar solvent may include acetone, toluene, etc. with dimethyl sulfoxide (DMSO). The second ink layer 32 is not mixed with the first non-polar solvent layer BF1, because the polar solvent and the solute of the second ink layer 32 have polarity.

Figure 4:
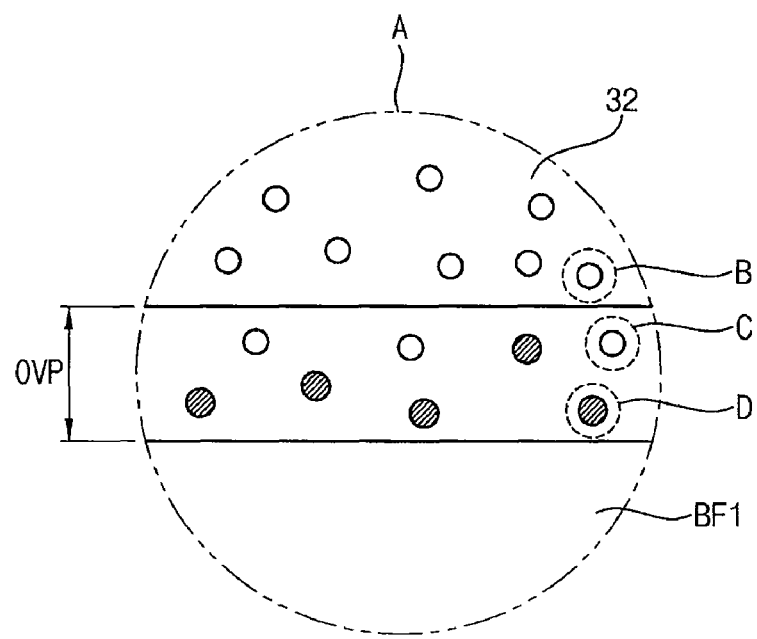

FIG. 4 is an enlarged cross-sectional view of portion A, as shown in FIG. 3. Referring to FIG. 4, the hole transport material is dissolved in the second ink layer 32 (see portion B in FIG. 4). In one implementation, the hole transport material is dissolved in a first boundary between the second ink layer 32 and the first non-polar solvent layer BF1 (see portion C in FIG. 4). The first boundary is a coexistence region of the polar solvent, which is included the second ink layer 32, and the non-polar solvent, which is included the first non-polar solvent layer BF1.

As time passes, the hole transport material in the boundary does not dissolve the polar solvent of the second ink layer 32 and the non-polar solvent of the first non-polar solvent layer BF1. Thus, the hole transport material may precipitate (see portion D in FIG. 4) in the first boundary to form a first precipitation layer OVP having precipitating hole transport materials.

Figure 5:
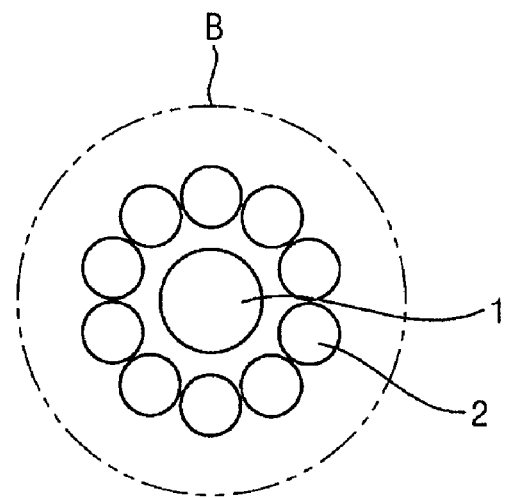
Figure 6:
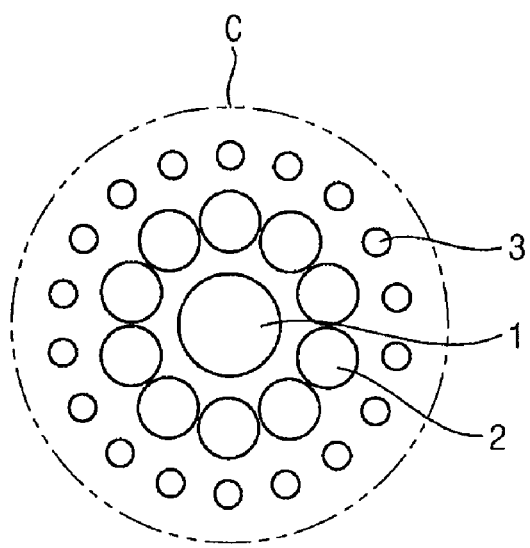
Figure 7:
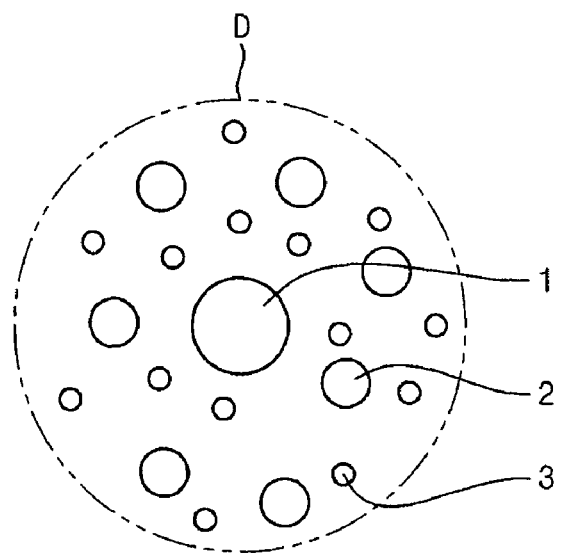

In FIGS. 5 to 7, the hole transport material is represented by element number "1" to illustrate aspects of the present disclosure, the polar solvent is represented by element number "2", and the non-polar solvent is represented by element number "3". In particular, FIG. 5 is an enlarged view of portion B in FIG. 4, FIG. 6 is an enlarged view of portion C in FIG. 4, and FIG. 7 is an enlarged view of portion D in FIG. 4.

Referring to FIG. 5, the hole transport material 1, in one embodiment, is surrounded by the polar solvent 2 so that the hole transport materials 1 become less distant from each other. Thus, the hole transport materials 1 are dissolved in the polar solvent 2, and the hole transport material 1 may not be seen from outside of a container in which the second ink is contained.

Referring to FIG. 6, the polar solvent 2, which surrounds the hole transport material 1, is surrounded by the non-polar solvent 3 of the first non-polar solvent layer BF1 in a boundary between the second ink layer 32 and the first non-polar solvent layer BF1. For a predetermined time, the hole transport material is dissolved in the boundary between the polar solvent 2 and the non-polar solvent 3.

Referring to FIG. 7, as time passes, the polar solvent 2 and the non-polar solvent 3 do not subsequently surround the hole transport material 1, because of a difference between the polarity and the non-polarity. Then, the polar solvent 2 and the non-polar solvent 3 randomly surrounds the hole transport material 1. Then, the distance between the hole transport materials 1 become more distant from each other, and a portion of the hole transport materials 1 precipitates in the second ink layer 32. Thus, the first precipitation layer OVP is formed by the portion of the hole transport materials 1.

Figure 8:
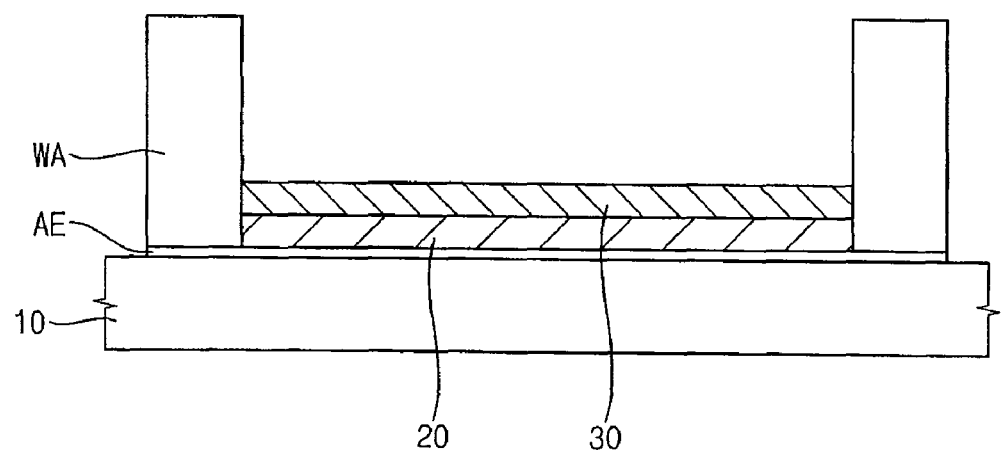

FIG. 8 is a cross-sectional view illustrating one embodiment of a process for forming a first transport layer. Referring to FIG. 8, the base substrate 10 having the second ink layer 32 which includes the first precipitation layer OVP is dried to form the first transport layer 30 on the first injection layer 20. The polar solvent of the second ink layer 32 and the first non-polar solvent layer BF1 are removed from the base substrate 10, and then the first transport layer 30 is formed on the first injection layer 20 by a drying process drying the polar solvent of the second ink layer 32 and the first non-polar solvent layer BF1. The drying process may be performed at a temperature of about 90° C. and for about 30 s (sec).

Similarly, the first transport layer 30 may be stably formed on the first injection layer 20 by forming the first non-polar solvent layer BF1 without damaging the first injection layer 20 by the polar solvent of the second ink layer 32. Thus, the reliability of manufacturing processes may be improved by forming the first non-polar solvent layer BF1.

Figure 9:
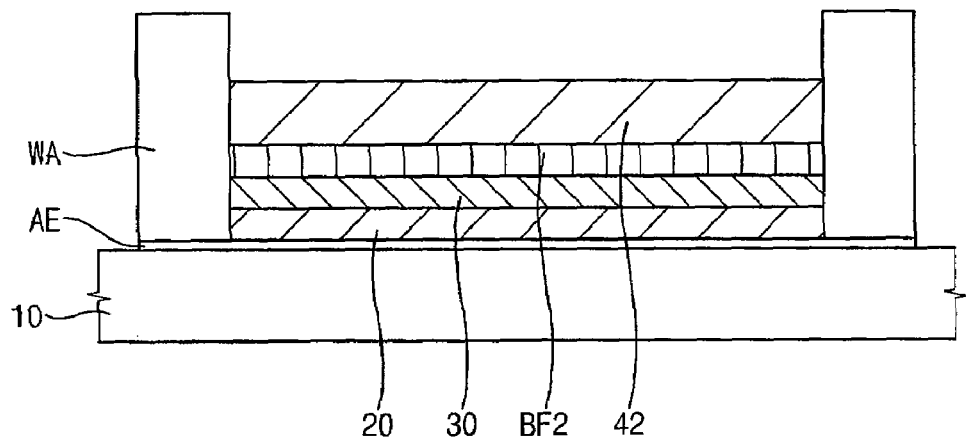
Figure 10:
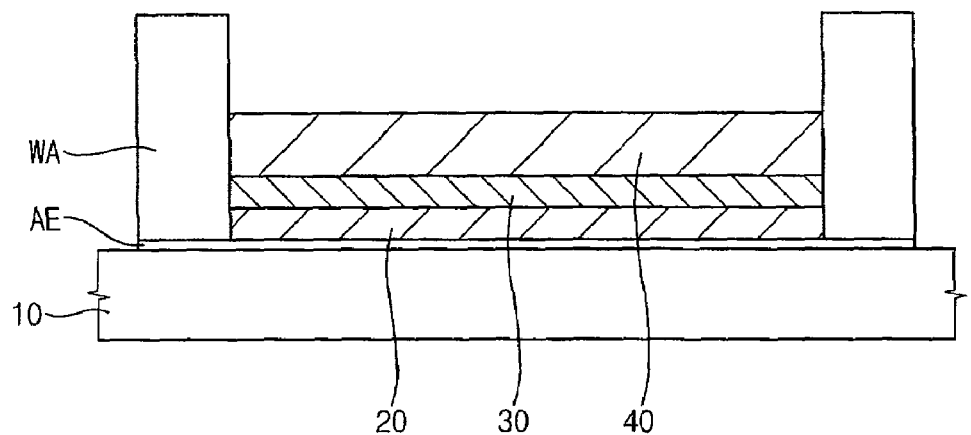

FIG. 9 is a cross-sectional view illustrating one embodiment of a process for forming a second non-polar solvent layer and a third ink layer as third polar solution layer, and FIG. 10 is a cross-sectional view illustrating one embodiment of a process for drying the third ink layer and the second non-polar solvent layer to form a light-emitting layer shown in FIG. 9. In FIGS. 9 and 10, the processes, which include forming the second non-polar solvent layer and the third ink layer and drying the third ink layer and the second non-polar solvent layer to form the first transport layer, except for materials forming the second non-polar solvent layer BF2, the third ink layer 42 and the light-emitting layer 40, are similar to or substantially the same as processes of forming the first non-polar solvent layer BF1 and the first ink layer 32 on the first injection layer 20, and forming the first transport layer 30 using the first non-polar solvent layer BF1 and the first ink layer 32 in FIGS. 2 to 8. Thus, any repetitive explanation will be omitted.

Referring to FIG. 9, a second non-polar solvent layer BF2 and a third ink layer 42 are formed on the first transport layer 30. Examples of a material that may be used for the second non-polar solvent layer BF2 may include hexane. The third ink layer 42 is formed by jetting or applying a third ink on the second non-polar solvent layer BF2. The third ink may be a solution including a polar light-emitting compound, a solute, dissolved in a polar solvent. For example, the light-emitting compound may include tris-(2-phenylpyridine)iridium (Ir(ppy)3), and the polar solvent may include dimethyl sulfoxide (DMSO). The second non-polar solvent layer BF2 does not dissolve the hole transport material and the light-emitting compound, because the hole transport material and the light-emitting compound are polar and the second non-polar solvent layer BF2 is non-polar. As time passes, the light-emitting compound may precipitate in a boundary between the second non-polar solvent layer BF2 and the third ink layer 42 to form a second precipitation layer (not shown) in the third ink layer 42.

Referring to FIG. 10, the base substrate 10 having the third ink layer 42, which includes the second precipitation layer, is dried to form a light-emitting layer 40 on the first transport layer 30. A drying process for drying the polar solvent of the third ink layer 42 and the second non-polar solvent layer BF2 may performed at a temperature of about 90° C. and for about 30 s. Similarly, the light-emitting layer 40 may be stably formed on the first transport layer 30 by forming the second non-polar solvent layer BF2 without damaging the first transport layer 30 by the polar solvent of the third ink layer 42.

Figure 11:
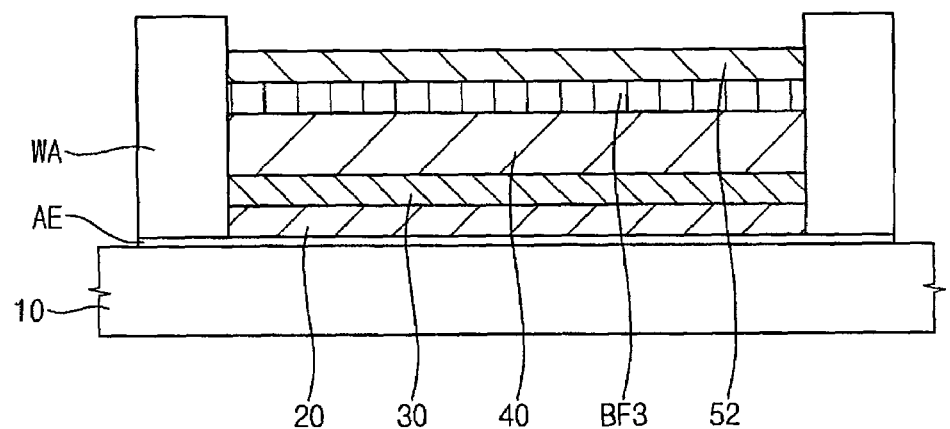
Figure 12:
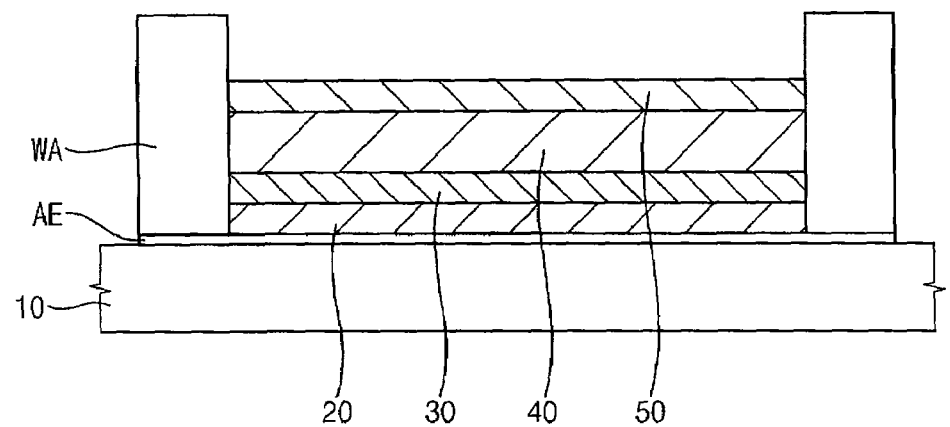

FIG. 11 is a cross-sectional view illustrating one embodiment of a process for forming a third non-polar solvent layer and a fourth ink layer. FIG. 12 is a cross-sectional view illustrating one embodiment of a process for drying the fourth ink layer to form a light-emitting layer shown in FIG. 11.

In FIGS. 11 and 12, the processes, which include forming a third non-polar solvent layer and a fourth ink layer and drying the fourth ink layer to form a light-emitting layer, except for materials forming the third non-polar solvent layer BF3, the fourth ink layer 52 and the second transport layer 50, are similar to or substantially the same as processes of forming the first non-polar solvent layer BF1 and the first ink layer 32 on the first injection layer 20, and forming the first transport layer 30 using the first non-polar solvent layer BF1 and the first ink layer 32 in FIGS. 2 to 8. Thus, any repetitive explanation will be omitted.

Referring to FIG. 11, a third non-polar solvent layer BF3 and a fourth ink layer 52 are formed on the light-emitting layer 40. Examples of a material that may be used for the third non-polar solvent layer BF3 may include hexane. The fourth ink layer 52 as a fourth polar solution layer may be formed by jetting or applying a fourth ink on the third non-polar solvent layer BF3. The fourth ink may be a solution including an electron transport material as a solute and a polar solvent. For example, the electron transport material may include tri-(8-quinolinolato)-aluminum (Alq3), and the polar solvent may include dimethyl sulfoxide (DMSO). The third non-polar solvent layer BF3 may not dissolve the light-emitting compound of the light-emitting layer 40 and the electron transport material, because the light-emitting compound of the light-emitting layer 40 and the electron transport material are polar and the third non-polar solvent layer BF3 has non-polarity. As time passes, the electron transport material may precipitate in a boundary between the third non-polar solvent layer BF3 and the fourth ink layer 52 to form a third precipitation layer (not shown) in the fourth ink layer 52.

Referring to FIG. 12, the base substrate 10 having the fourth ink layer 52, which includes the third precipitation layer, is dried to form a second transport layer 50. A drying process for drying the polar solvent of fourth ink layer 52 and the third non-polar solvent layer BF3 may performed at a temperature of about 90° C. and for about 30 s. Similarly, the second transport layer 50 may be stably formed on the light-emitting layer 40 by forming the third non-polar solvent layer BF3 without damaging the light-emitting layer 30 by the polar solvent of the fourth ink layer 52.

Figure 13:
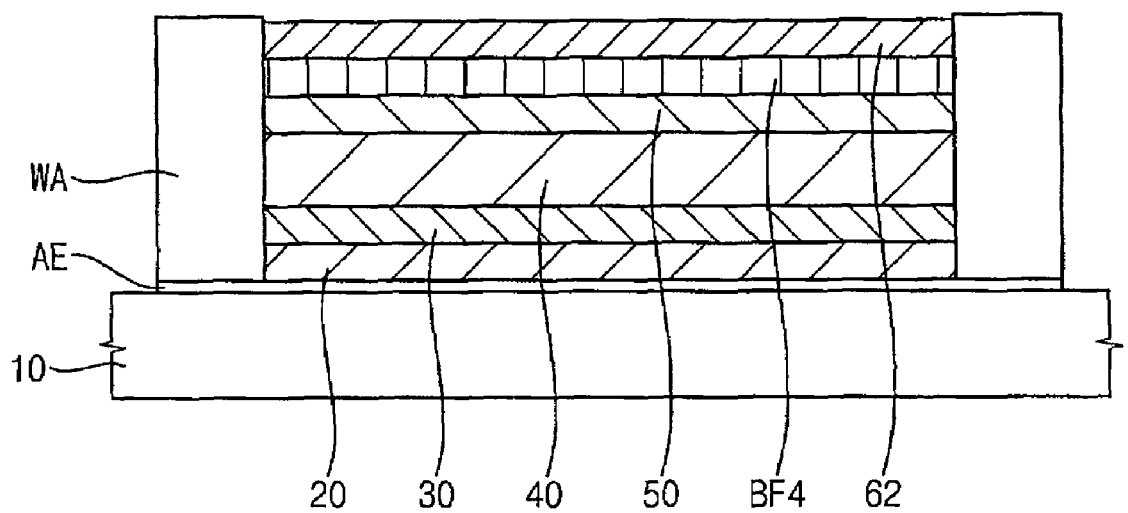

FIG. 13 is a cross-sectional view illustrating one embodiment of a process for forming a fourth non-polar solvent layer and a fifth ink layer. In FIG. 13, the process, except for materials forming the fourth non-polar solvent layer and the fifth ink layer, is similar to or substantially the same as a process of forming the first non-polar solvent layer BF1 and the first ink layer 32 on the first injection layer 20, and forming the first transport layer 30 using the first non-polar solvent layer BF1 and the first ink layer 32 in FIGS. 2 to 8. Thus, any repetitive explanation will be omitted.

Referring to FIG. 13, a fourth non-polar solvent layer BF4 and a fifth ink layer 62 are formed on the second transport layer 50. Examples of a material that may be used for the fourth non-polar solvent layer BF4 may include hexane. The fifth ink layer 62 is formed using a solution having an electron injection material as a solute and a polar solvent. For example, the electron injection material may include lithium quinolate (LiQ), and the polar solvent may include dimethyl sulfoxide (DMSO).

As time passes, the electron injection material may precipitate in a boundary between the fourth non-polar layer BF4 and the fifth ink layer 62 to form a fourth precipitation layer (not shown) in the fifth ink layer 62. The base substrate 10 having the fifth ink layer 62 which includes the fourth precipitation layer is dried to form a second injection layer 60. Similarly, the second injection layer 60 may be stably formed on the second transport layer 50 by forming the fourth non-polar solvent layer BF4 without damaging the second transport layer 50 by the polar solvent of the fifth ink layer 62.

In accordance with one embodiment of the present disclosure, a method for manufacturing a light-emitting element having five layers and the light-emitting element are illustrated. In some embodiments, the method is applied to manufacturing various light-emitting elements such as a light-emitting element of two layers type having a hole transport layer, (HTL) and a light-emitting layer (EML), a light-emitting element of three layers type having a hole transport layer (HTL), a light-emitting layer (EML) and an electron transport layer (ETL), etc.

In accordance with one or more embodiments of the present disclosure, when a second layer having polarity is formed on a first layer having the polarity by a wet process, a solvent layer having non-polarity is formed on the first layer, so that damage to the first layer may be reduced and the reliability of processes for forming the layers may be improved. Moreover, in various implementations, the productivity of the processes may be improved by repetitively performing a jetting or application process and a drying process of the wet process to form a plurality of layers.

Figure 14:
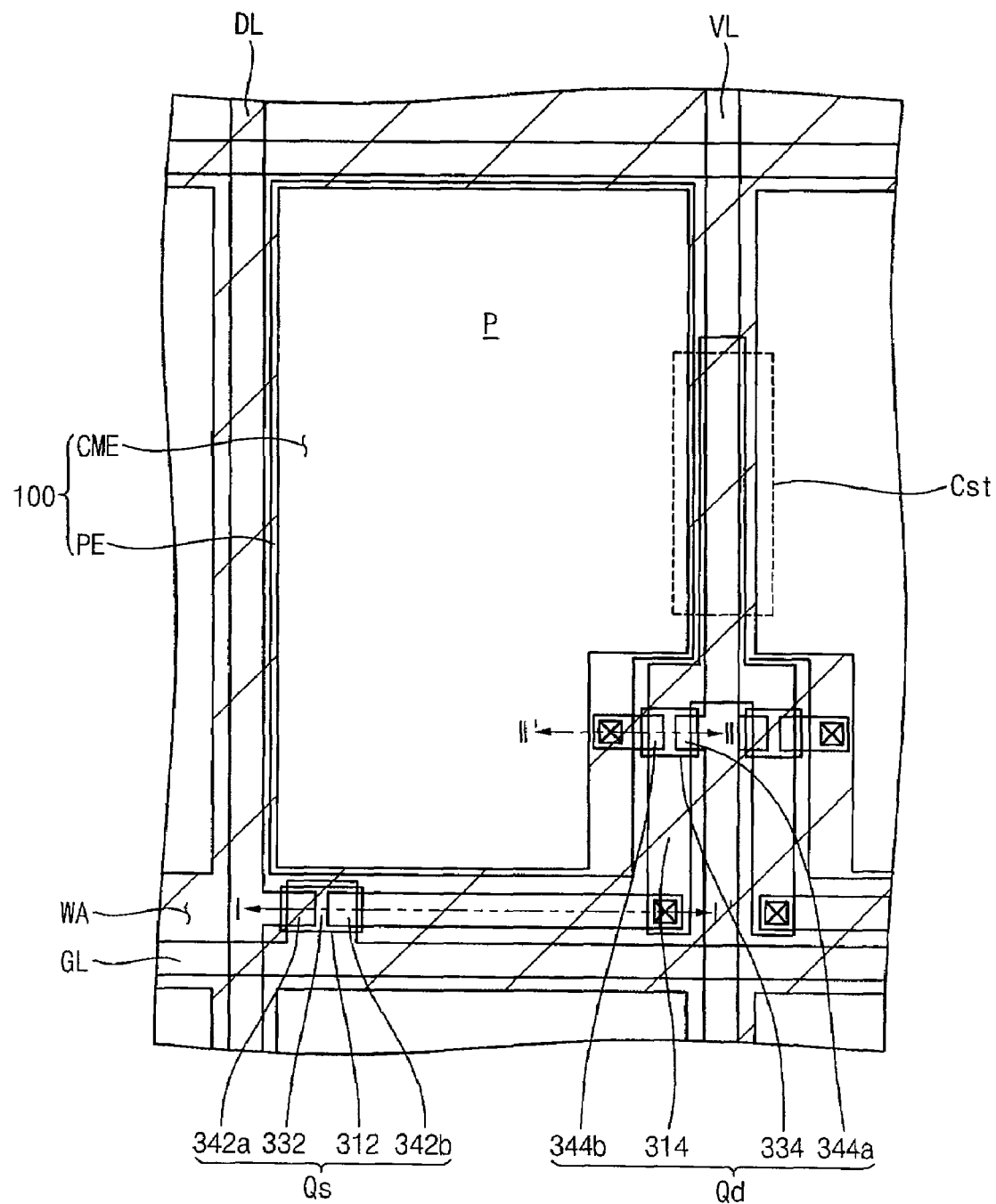
FIG. 14 is a planar view illustrating a display substrate having the light-emitting element illustrated in FIG. 1.

FIG. 14 is a planar view illustrating one embodiment of a display substrate having the light-emitting element illustrated in FIG. 1. Referring to FIG. 14, a display substrate 300 according to an embodiment of the present disclosure includes a gate line GL, a data line DL, a power supply line VL, a switching element Qs, a driving element Qd, a storage capacitor Cst and light-emitting element 100.

The gate line GL, in one embodiment, may be extended in a first direction of the display substrate 300, and a plurality of the gate lines GL may be arranged parallel to each other in a second direction. For example, the first direction and the second direction may be perpendicular to each other. The gate line GL may apply a gate signal to the switching element Qs. The data line DL may be extended in the second direction, and a plurality of the data lines DL may be arranged parallel to each other. The data line DL may apply a data signal to the switching element Qs.

The power supply line VL, in one embodiment, may be extended in the second direction, and a plurality of the power supply lines VL may be arranged parallel to each other. The power supply line VL may be disposed between the data lines DL. The power supply line VL may be disposed between the pixel units P, and then the power supply line VL may be electrically connected to a driving element Qd in one pixel unit P and another driving element Qd in another pixel unit P disposed adjacent to the one pixel unit P.

The switching element Qs, in one embodiment, is formed at the pixel unit P, and includes a switching gate electrode 312, a switching source electrode 342a, a switching drain electrode 342b and a switching active pattern 332. The switching gate electrode 312 is connected to the gate line GL, and the switching source electrode 342a is connected to the data line DL. The switching source electrode 342b is spaced apart from the switching source electrode 342a. The switching electrode 342b is electrically connected to the driving element Qd.

The driving element Qd, in one embodiment, is formed at the pixel unit P, and includes a driving gate electrode 314, a driving source electrode 344a, a driving drain electrode 344b and a driving active pattern 334. The driving source electrode 344a is connected to the power supply line VL. The driving drain electrode 344b is spaced apart from the driving source electrode 344a. The driving drain electrode 344b is electrically connected to the light-emitting element 100.

The storage capacitor Cst, in one embodiment, may charge a driving voltage applying the driving gate electrode 312. The storage capacitor Cst is defined by the driving gate electrode 312 and the power supply line VL overlapping the driving gate electrode 312. The driving gate electrode 312 may be a first electrode of the storage capacitor Cst, the voltage supply line VL may be a second electrode of the storage capacitor Cst, the second electrode opposing the first electrode.

The light-emitting element 100, in one embodiment, includes the pixel electrode PE making contact with the driving drain electrode 344b, the common electrode CME opposing the pixel electrode PE, and a light-emitting layer (not shown) interposed between the pixel electrode PE and the common electrode CME.

In accordance with one embodiment of a method of driving the light-emitting element 100, the pixel electrode PE is applied to the driving element Qd, and the common electrode CME is applied to a common voltage from external element. The light-emitting layer receives an electron hole from the pixel electrode PE and an electron from the common electrode CME, and then the electron hole and the electron are combined to form an exciton in the light-emitting layer. In one aspect, an energy state of the exciton changes to the ground state to emit light.

Figure 15:
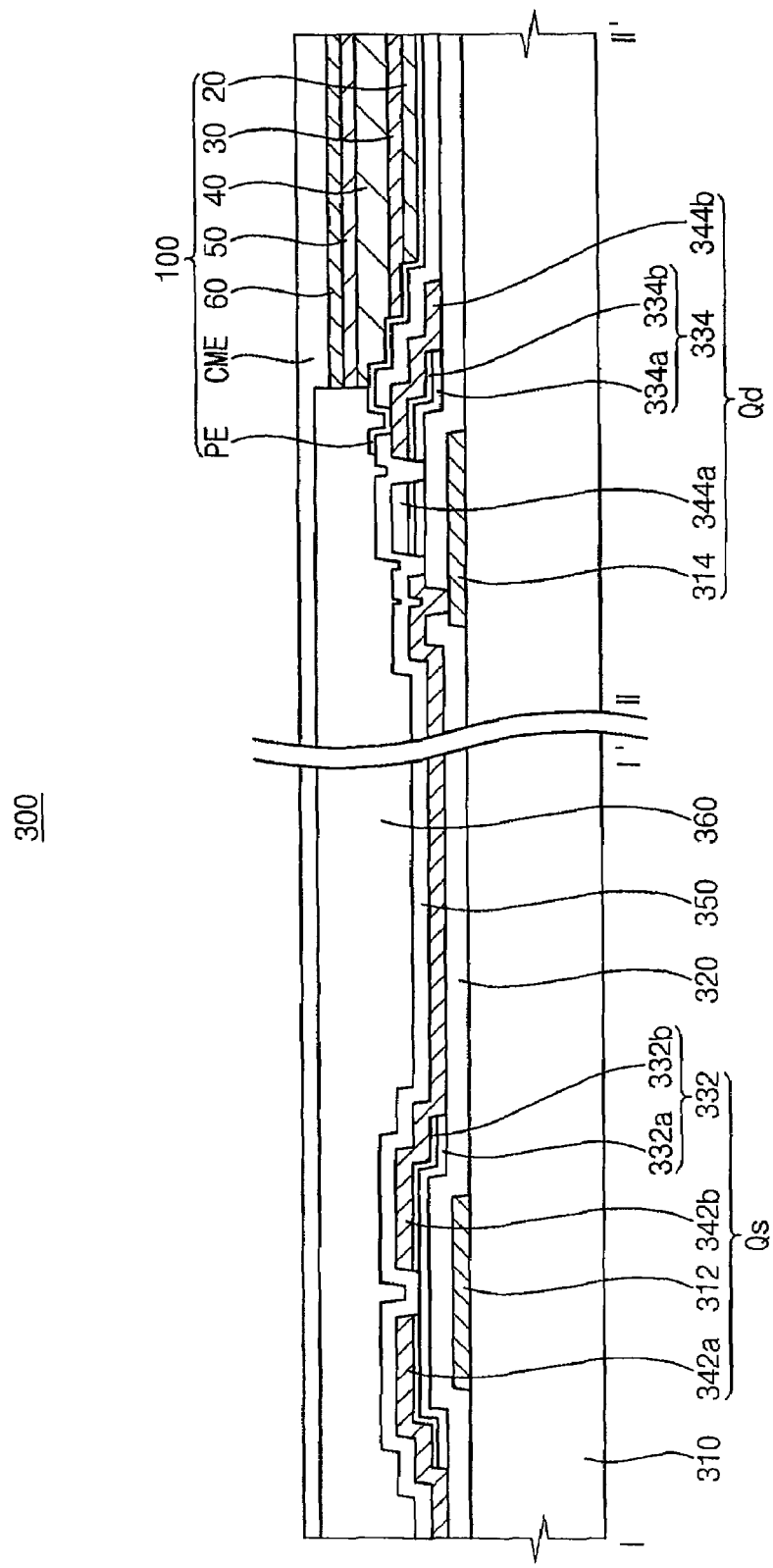
FIG. 15 is a cross-sectional view taken along a line I-I' and a line II-II' shown in FIG. 14.

FIG. 15 is a cross-sectional view taken along a line I-I' and a line II-II' shown in FIG. 14. Referring to FIG. 15, the display substrate 300, according to an embodiment of the present disclosure, includes a base substrate 310, a gate insulation layer 320 and a passivation layer 350. The light-emitting element 100 includes a first injection layer 20 and a first transport layer 30 formed under the light-emitting layer 40, and a second transport layer 50 and a second injection layer 60 formed on the light-emitting layer 40.

Referring to FIGS. 14 and 15, the gate line GL, the switching gate electron 310 and the driving gate electrode 314 are formed on the base substrate 310 of the display substrate 300. The gate insulation layer 320, in one embodiment, is formed on the base substrate 310 having the gate line GL, the switching gate electrode 312 and the driving gate electrode 314. Examples of a material that may be used for the gate insulation layer 320 may include silicon nitride, silicon oxide, etc. The gate insulation layer 320 includes a contact hole exposing a portion of the driving gate electrode 314.

The switching active pattern 322, in one embodiment, is formed on the gate insulation layer 320 corresponding to the switching gate electrode 312. The switching active pattern 332 includes a first semiconductor layer 332a and a first ohmic contact layer 332b. Examples of a material that may be used for the first semiconductor layer 332a may include amorphous silicon (a-Si), and examples of a material that may be used for the first ohmic contact layer 332b may include amorphous silicon into which n+ impurities are implanted at a high concentration.

The driving active pattern 334, in one embodiment, is formed on the gate insulation layer 320 corresponded the driving gate electrode 314. In one embodiment, the driving active pattern 334 may include a second semiconductor layer 334a and a second ohmic contact layer 334b. Examples of a material that may be used for the second semiconductor layer 334a may include amorphous silicon (a-Si), and examples of a material that may be used for the second ohmic contact layer 334 may include amorphous silicon into which n+ impurities are implanted at a high concentration. In some embodiments, the driving active pattern 334 may include polycrystalline silicon, microcrystalline silicon, etc.

The data line DL, the voltage supply line VL, the switching source electrode 342a, the switching drain electrode 342b, the driving source electrode 344a and the driving drain electrode 344b are formed on the base substrate 310 having the switching active pattern 332 and the driving active pattern 334. The switching drain electrode 342b makes contact with the driving gate electrode 314 through the contact hole of the gate insulation layer 320.

The passivation layer 340, in one embodiment, is formed on the base substrate 310 having the data line DL, the voltage supply line VL, the switching source electrode 342a, the switching drain electrode 342b, the driving source electrode 344a and the driving drain electrode 344b. The passivation 340 includes a contact hole exposing a portion of the driving drain electrode 344b.

The pixel electrode PE, in one embodiment, is formed on the passivation layer 340. The pixel electrode PE makes contact with the driving drain electrode 344b through the contact hole of the passivation layer 340. The pixel electrode PE serves as an anode of the light-emitting element 100, and the pixel electrode PE gives an electron hole to the light-emitting layer 40.

An insulation wall 360, in one embodiment, may be further formed on the base substrate 310 having the pixel electrode PE. The insulation wall 360 may expose the pixel electrode PE, and the insulation wall 360 may cover the gate line GL, the data line DL, the voltage supply line VL, the switching element Qd and the driving element Qd. The insulation wall 360 may be formed using an organic material having photosensitivity.

In one embodiment, the first injection layer 20, the first transport layer 30, the light-emitting layer 40, the second transport layer 50 and the second injection layer 60 are formed on the pixel electrode PE exposed by the insulation wall 360. The first injection layer 20 and the first transport layer 30 give the electron hole received from the pixel electrode PE to the light-emitting layer 40. Each of the first injection layer 20, the first transport layer 30, the light-emitting layer 40, the second transport layer 50 and the second injection layer 60 is formed using a polar compound.

The common electrode CME, in one embodiment, is entirely formed on the base substrate 310 having the second injection layer 60 and the insulation wall 360. The common electrode CME gives an electron to the second injection layer 60, and the electron is transferred to the light-emitting layer 40 through the second transport layer 50 and the second injection layer.

Figure 16:
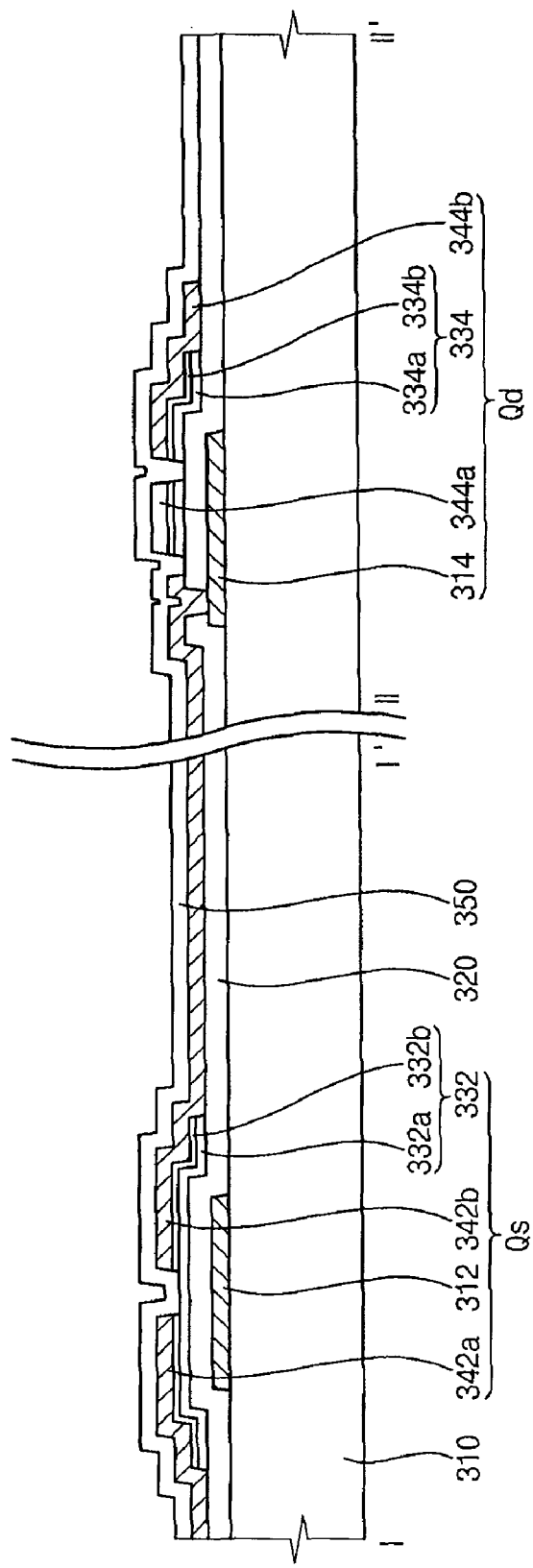
FIGS. 16 to 18 are cross-sectional views illustrating a method of manufacturing the display substrate illustrated in FIG. 14.
Figure 17:
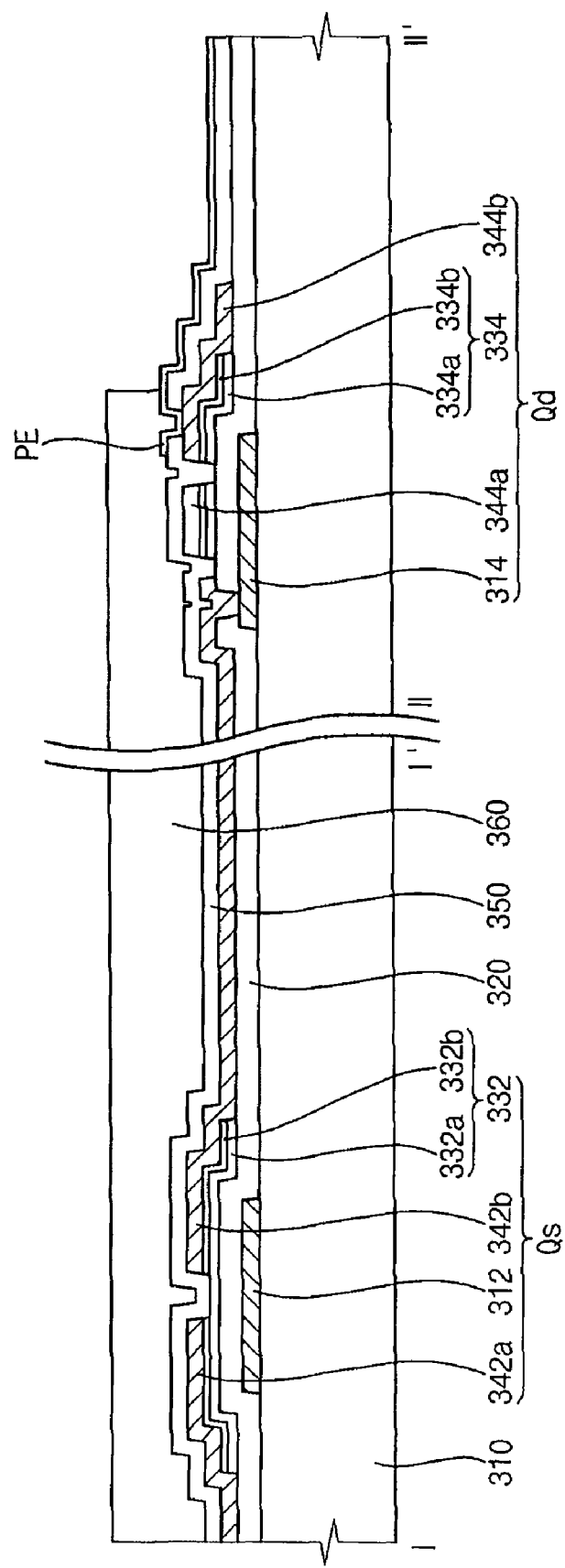
Figure 18:
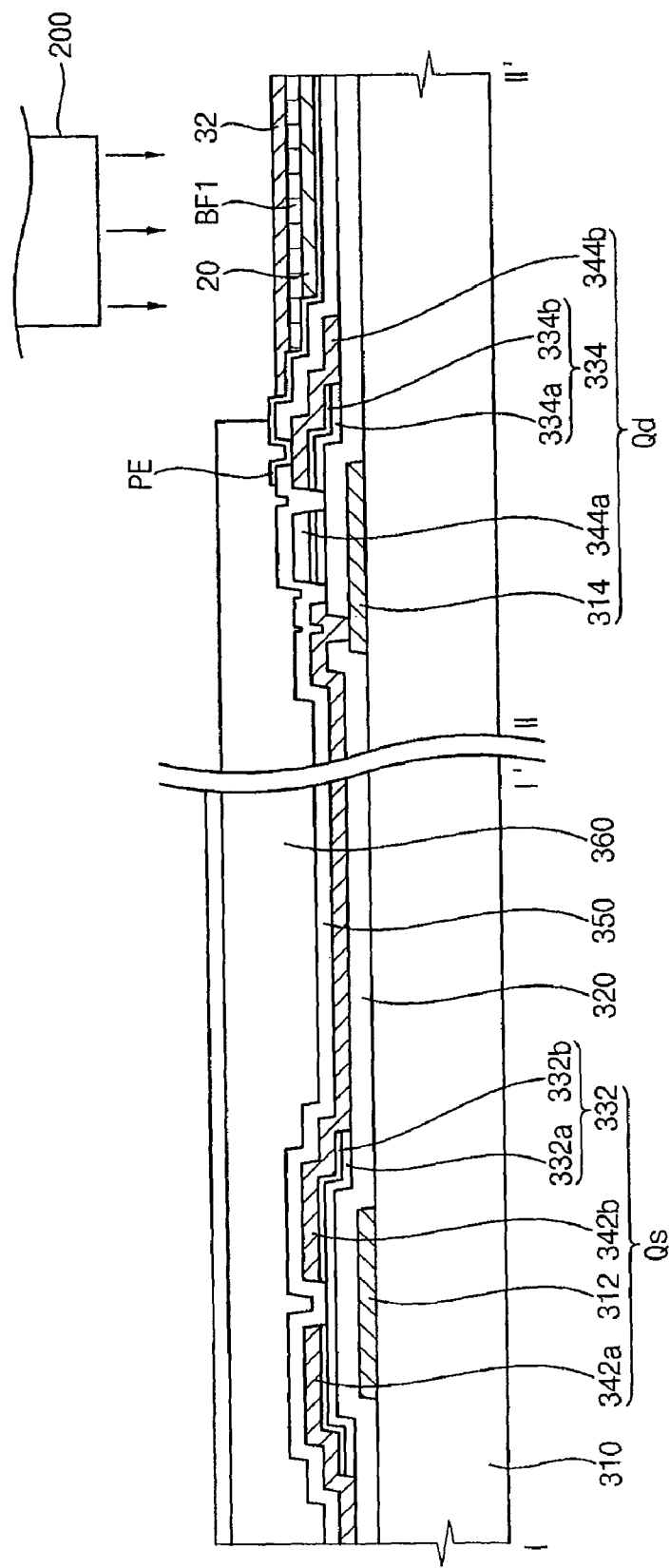

FIGS. 16 to 18 are cross-sectional views illustrating one embodiment of a method for manufacturing the display substrate illustrated in FIG. 14. In particular, referring to FIG. 16, a gate metal layer is formed on the base substrate 310, and the gate metal layer is patterned by a photolithography process to form the switching gate electrode 312 and the driving gate electrode 314. The gate insulation layer 320 is formed on the base substrate 310 having the switching gate electrode 312 and the driving gate electrode 314. The switching active pattern 332 and the driving active pattern 334 are formed on the base substrate 310 having the gate insulation layer 320.

In one embodiment, an amorphous silicon layer and an ohmic contact layer are formed on the gate insulation layer 320, and the amorphous silicon layer and the ohmic contact layer are patterned by a photolithography process to form the switching active pattern 332 and the driving active pattern 334. In some embodiments, when the driving active pattern 334 may be formed using a different material from a material forming the switching active pattern 332, the driving active pattern 334 may be formed by a different process from a process for forming the switching active pattern 332. A source metal layer (not show) is formed on the base substrate 310 having the switching active pattern 332 and the driving active pattern 334. The source metal layer is patterned to form the switching source electrode 342a, the switching drain electrode 342b, the driving source electrode 344a and the driving drain electrode 344b. The passivation layer 350 is formed on the base substrate 310 having the switching source electrode 342a, the switching drain electrode 342b, the driving source electrode 344a and the driving drain electrode 344b.

Referring to FIG. 17, a transparent conduction layer (not show) is formed on the base substrate 310 having the passivation layer 350, and the transparent conduction layer is patterned to form the pixel electrode PE. Examples of a material that may be used for the transparent conduction layer may include indium tin oxide (ITO), indium zinc oxide (IZO), etc. An organic layer (not shown) is formed on the base substrate 310 having the pixel electrode PE, and the organic layer is patterned to form the insulation wall 360. The pixel electrode PE may be exposed by the insulation wall 360.

Referring to FIG. 18, the first injection layer 20, the first non-polar solvent layer BF1 and the second ink layer 32 are formed on the pixel electrode PE exposed by the insulation wall 360. In one embodiment, the first non-polar solvent layer BF1 and the second ink layer 32 are formed on the pixel electrode PE. A polar solvent of the second ink layer 32 and the first non-polar solvent layer BF1 are dried to form the first transport layer 30 on the first injection layer 20. A method of forming the light-emitting element 100 having a process of forming the first transport layer 30 is substantially the same as that of FIGS. 2 to 13. Thus, any repetitive explanation will be omitted.

In one embodiment, the light-emitting layer 40, the second transport layer 50 and the second injection layer 60 are formed on the second injection layer 60. Subsequently, the common electrode CME is entirely formed on the base substrate 310 having the second injection layer 60. An opposing substrate (not shown) may be disposed on the common electrode CME protecting light-emitting element 100.

In accordance with one or more embodiments of the present disclosure, when a second layer having polarity is formed on a first layer having the polarity by a wet process, a solvent layer having non-polarity is formed on the first layer, so that damage to the first layer may be reduced and the reliability of processes for forming the layers may be improved. In various aspects, the productivity of the processes may be improved by repetitively performing a jetting or application process and a drying process of the wet process to form a plurality of layers.

The foregoing is illustrative of the present teachings and is not to be construed as limiting thereof. Although one or more embodiments of the present disclosure have been described, those skilled in the art will readily appreciate in light of the foregoing that many modifications are possible in the embodiments without materially departing from the novel teachings and advantages of this disclosure. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative of the present teachings and is not to be construed as limited to the specific embodiments disclosed, and that modifications to the disclosed embodiments, as well as other embodiments, are intended to be included within the scope of the teachings.

What is claimed is:

1. A method for manufacturing a light-emitting element, the method comprising:
    forming a first electrode on a substrate;
    forming a first charge transport layer comprising one or more first charge transport materials that are polar compounds on the first electrode;
    depositing a first solution on the first charge transport layer, the first solution including a non-polar first solvent, to thus form a wet first non-polar solvent layer on the first charge transport layer;
    depositing a second solution on the first solution, the second solution including a first polar solvent and one or more light-emitting compounds dissolved in the first polar solvent to thus form a wet first polar solution layer disposed on the wet first non-polar solvent layer;
    simultaneously removing, by drying, both the polar solvent of the wet first polar solution layer and the non-polar solvent of the wet first non-polar solvent layer so that a solidified light-emitting layer comprising the one or more light-emitting compounds is formed on the first charge transport layer; and
    forming a second electrode on the light-emitting layer.

2. The method of claim 1, wherein the non-polar solvent of the first non-polar solvent layer includes at least one selected from the group consisting of benzene, ether, trichloromethane (chloroform), pentane and hexane.

3. The method of claim 1, wherein the first polar solution layer has a first precipitation layer formed by precipitating a portion of the one or more light-emitting compounds and formed at a boundary portion between the first non-polar solvent layer and the first polar solution layer.

4. The method of claim 1, wherein the polar solvent of the first polar solution layer includes at least one selected from the group consisting of propanone (acetone), phenylmethane toluol methylbenzene (toluene) and dimethyl sulfoxide.

5. The method of claim 1, further comprising forming a second charge transport layer between the light-emitting layer and the second electrode, wherein said forming of the second transport layer comprises:
    depositing a third solution on the solidified light-emitting layer, the third solution including a non-polar second solvent, to thus form a wet second non-polar solvent layer on the light-emitting layer;
    depositing a fourth solution on the second non-polar solvent layer, the fourth solution including a polar second solvent and one or more second polar compounds, to thus form a wet second polar solution layer including the one or more second polar compounds; and
    simultaneously removing by drying both the polar solvent of the wet second polar solvent layer and the non-polar solvent of the wet second non-polar solvent layer so that the second charge transport layer including the one or more second polar compounds is formed as a solidified layer on the solidified light-emitting layer.

6. The method of claim 5, wherein the second polar solution layer has a second precipitation layer formed by precipitating a portion of the one or more second compounds and formed at a boundary portion between the second non-polar solvent layer and the second polar solution layer.

7. The method of claim 5, further comprising forming a first injection layer including one or more third polar compounds between the substrate and the first charge transport layer.

8. The method of claim 7, wherein the forming of the first charge transport layer comprises:

depositing a fifth solution on the first injection layer, the fifth solution including a non-polar third solvent, to thus form a wet third non-polar solvent layer on the first injection layer;

depositing a sixth solution on the third non-polar solvent layer, the sixth solution including a polar third solvent and the one or more first polar compounds, to thus form a wet third polar solution layer including the one or more first polar compounds on the third non-polar solvent layer; and simultaneously removing by drying both the polar solvent of the third polar solution layer and the non-polar solvent of the third non-polar solvent layer so that the first transport layer is formed as a solidified layer on the first injection layer.

9. The method of claim 8, wherein the third polar solution layer has a third precipitation layer formed by precipitating a portion of the one or more third compounds and formed at a boundary portion between the third non-polar solvent layer and the third polar solution layer.

10. The method of claim 8, further comprising forming a second injection layer between the second charge transport layer and the second electrode, wherein said forming of the second injection layer comprises:

depositing a seventh solution on the second charge transport layer, the seventh solution including a non-polar fourth solvent and one or more fourth polar compounds, to thus form a wet fourth non-polar solvent layer including the one or more fourth polar compounds on the second charge transport layer; and simultaneously removing by drying both the polar solvent of the fourth polar solution layer and the non-polar solvent of the fourth non-polar solvent layer so that the second injection layer is formed as a solidified layer on the second charge transport layer.

11. The method of claim 10, wherein the fourth polar solution layer has a fourth precipitation layer formed by precipitating a portion of the one or more fourth compounds and formed at a boundary portion between the fourth non-polar solvent layer and the fourth polar solution layer.

12. A method for manufacturing a display substrate, the method comprising:

forming a switching element connected to a gate line and a data line extended in a direction crossing the gate line, and a driving element electrically connected to the switching element;

forming a pixel electrode on a substrate having the switching element and the driving element, the pixel electrode electrically connected to the driving element;

forming a first charge transport layer including one or more first polar compounds on the pixel electrode;

depositing a first solution on the first charge transport layer, the first solution including a non-polar first solvent, to thus form a wet first non-polar solvent layer on the first charge transport layer;

depositing a second solution on the first solution, the second solution including a first polar solvent and one or more light-emitting compounds dissolved in the first polar solvent to thus form a wet first polar solution layer disposed on the wet first non-polar solvent layer;

simultaneously removing, by drying, both the polar solvent of the first polar solution layer and the non-polar solvent of the first non-polar solvent layer so that a solidified light-emitting layer is formed on the first charge transport layer; and forming a common electrode on the light-emitting layer such that the common electrode is disposed opposite to the pixel electrode.

13. The method of claim 12, wherein the first polar solution layer has a first precipitation layer formed by precipitating a portion of the one or more light-emitting compounds and formed at a boundary portion between the first non-polar solvent layer and the first polar solution layer.

14. The method of claim 12, further comprising forming a second charge transport layer between the light-emitting layer and the common electrode, wherein the forming of the second charge transport layer comprises:

depositing a third solution on the solidified light-emitting layer, the third solution including a non-polar second solvent, to thus form a wet second non-polar solvent layer on the light-emitting layer;

depositing a fourth solution on the second non-polar solvent layer, the fourth solution including a polar second solvent and one or more second polar compounds, to thus form a wet second polar solution layer including the one or more second polar compounds on the second non-polar solvent layer; and simultaneously removing, by drying, both the polar solvent of the wet second polar solution layer and the non-polar solvent of the wet second non-polar solvent layer so that the second charge transport layer is formed as a solidified layer on the light-emitting layer.

15. The method of claim 14, further comprising forming a first injection layer between the pixel electrode and the first charge transport layer, wherein the forming of the first injection layer comprises:

depositing a fifth solution on the pixel electrode, the fifth solution including a non-polar third solvent, to thus form a wet third non-polar solvent layer on the pixel electrode;

depositing a sixth solution on the third non-polar solvent layer, the sixth solution including a polar third solvent and one or more first polar compounds, to thus form a wet third polar solution layer including the one or more first polar compounds on the third non-polar solvent layer; and simultaneously removing by drying both the polar solvent of the third polar solution layer and the non-polar solvent of the third non-polar solvent layer so that the first injection layer is formed as a solidified layer on the pixel electrode.

16. The method of claim 15, further comprising forming a second injection layer including one or more fourth polar compounds between the second charge transport layer and the common electrode.

17. The method of claim 12, further comprising forming an insulation wall exposing the pixel electrode and covering the switching element and the driver element.

18. A method comprising:

forming an anode on a substrate;

forming a first charge transport layer on the anode;

depositing a first solution on the first charge transport layer, the first solution including a non-polar first solvent, to thus form a wet first solvent layer on the first charge transport layer;

depositing a second solution on the first solution, the second solution including a first polar solvent and one or more light-emitting compounds dissolved in the first polar solvent to thus form a wet first solution layer on the first solvent layer;

simultaneously removing, by drying, both a portion of the wet first solution layer and a portion of the wet first solvent layer so as to form a solidified light-emitting layer on the first charge transport layer; and forming a cathode on the light-emitting layer.

19. The method of claim 18, wherein forming the first charge transport layer on the anode comprises forming the first charge transport layer with one or more first polar compounds on the anode.

20. The method of claim 18, wherein forming the first solvent layer on the first charge transport layer comprises forming a first non-polar solvent layer on the first transport layer.

21. The method of claim 18, wherein drying a portion of the first solution layer and a portion of the first solvent layer comprises drying a polar solvent of the first solution layer and a non-polar solvent of the first solvent layer so as to form the light-emitting layer on the first transport layer.

22. The method of claim 18, wherein forming the cathode on the light-emitting layer disposes the cathode opposite to the anode.

* * * * *